US009269545B2

(12) United States Patent
Vetter

(10) Patent No.: US 9,269,545 B2
(45) Date of Patent: Feb. 23, 2016

(54) VACUUM ARC VAPORISATION SOURCE AND ALSO A VACUUM ARC VAPORISATION CHAMBER WITH A VACUUM ARC VAPORISATION SOURCE

(75) Inventor: Joerg Vetter, Bergisch-Gladbach (DE)

(73) Assignee: OERLIKON SURFACE SOLUTIONS AG, TRUEBBACH, Truebbach (CH)

( * ) Notice: Subject to any disclaimer, the term of this patent is extended or adjusted under 35 U.S.C. 154(b) by 1026 days.

(21) Appl. No.: 12/595,273

(22) PCT Filed: Mar. 11, 2008

(86) PCT No.: PCT/EP2008/052844
§ 371 (c)(1),
(2), (4) Date: Feb. 23, 2010

(87) PCT Pub. No.: WO2008/125397
PCT Pub. Date: Oct. 23, 2008

(65) Prior Publication Data
US 2010/0213055 A1    Aug. 26, 2010

(30) Foreign Application Priority Data
Apr. 17, 2007 (EP) .................................... 07106345

(51) Int. Cl.
*C23C 14/34* (2006.01)
*H01J 37/32* (2006.01)
*H01J 37/305* (2006.01)

(52) U.S. Cl.
CPC ......... *H01J 37/3266* (2013.01); *H01J 37/3053* (2013.01); *H01J 37/32055* (2013.01); *H01J 37/32669* (2013.01); *H01J 2237/3132* (2013.01)

(58) Field of Classification Search
CPC .................... H01J 37/32055; H01J 37/32064; H01J 37/3266

USPC ........................................ 204/298.41, 192.38
See application file for complete search history.

(56) References Cited

U.S. PATENT DOCUMENTS 4,620,913 A *   11/1986   Bergman ................... 204/192.1
6,334,405 B1 *   1/2002    Takahara et al. ........ 118/723 VE
(Continued)

FOREIGN PATENT DOCUMENTS

| DE | 19739527 A1 | 3/1999 |
|---|---|---|
| EP | 0495447 A1 | 7/1992 |
| JP | 62047477 A | 3/1987 |
| JP | 63-446 | 1/1988 |
| JP | 4045262 A | 2/1992 |

(Continued)

OTHER PUBLICATIONS

International Search Report for international patent application PCT/EP2008/052844 dated Apr. 29, 2008.

*Primary Examiner* — Jason M Berman
(74) *Attorney, Agent, or Firm* — Greenblum & Bernstein, P.L.C.

(57) ABSTRACT

The invention relates to a vacuum arc source (1), including ring-like magnetic field source (2) and a cathode body (3) with an vaporization material (31) as a cathode (32) for the production of an arc discharge on an vaporization surface (33) of the cathode (32). In this arrangement the cathode body (3) is bounded in an axial direction in a first axial direction by a cathode base (34) and in a second axial direction by the vaporization surface (33) and the ring-like magnetic (2) is arranged polarised parallel or anti-parallel and concentric to a surface normal (300) of the vaporization surface (33). In accordance with the invention a magnetic field enhancement ring (4) is arranged on a side remote from the vaporization surface (33) at a pre-determinable second spacing (A2) in front of the cathode base (34). The invention further relates to an arc vaporization chamber (10) with an arc vaporization source (1).

34 Claims, 11 Drawing Sheets

(56) References Cited

U.S. PATENT DOCUMENTS

Figure 1:
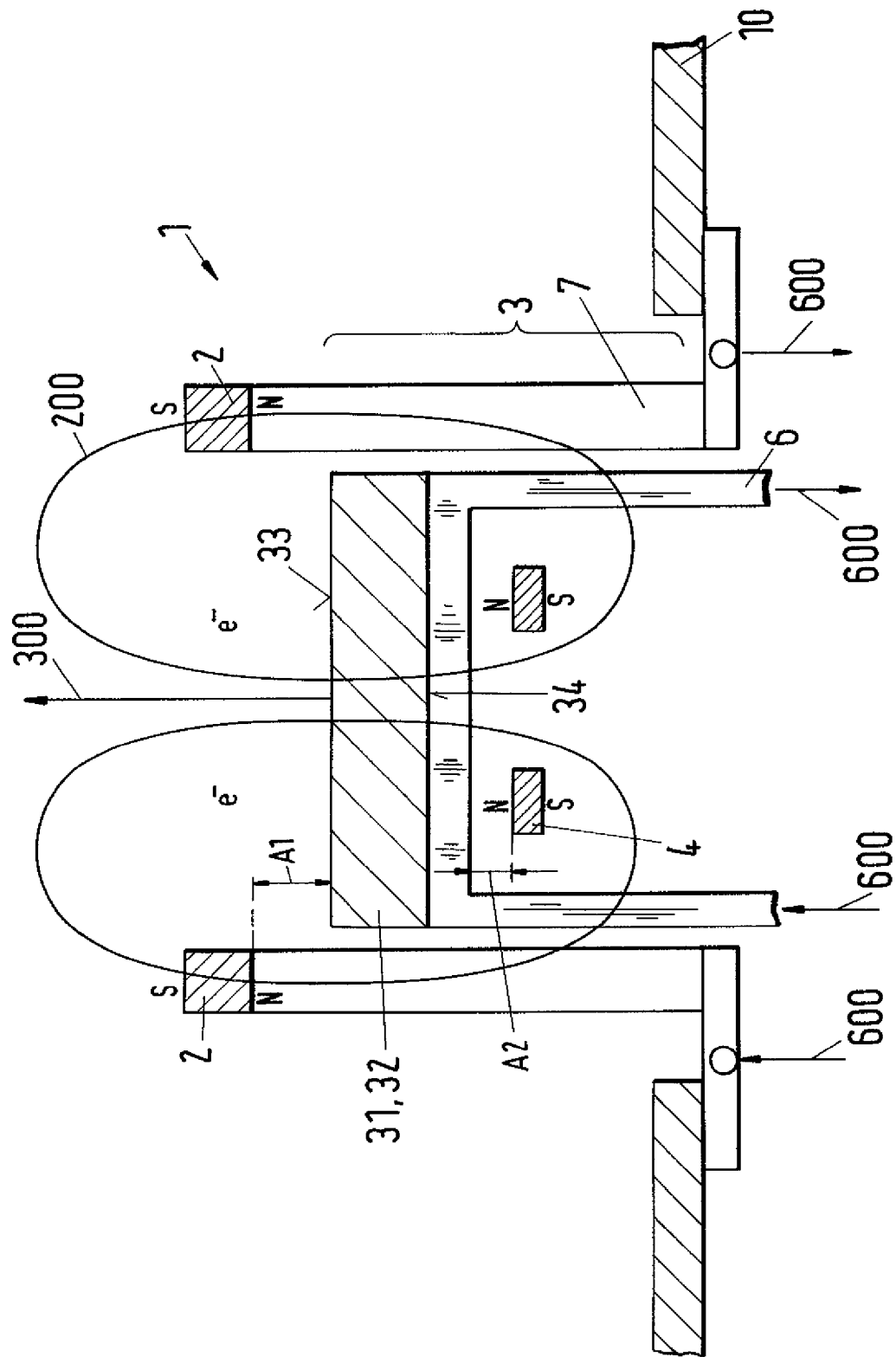

| | | |
|---|---|---|
| 7,828,946 B2 | 11/2010 | Larrinaga |
| 2004/0134771 A1 | 7/2004 | Setoyama |
| 2006/0175190 A1 | 8/2006 | Schuetze et al. |
| 2006/0237309 A1* | 10/2006 | Goikoetxea Larrinaga ............ 204/298.41 |
| 2007/0000772 A1* | 1/2007 | Ramm et al. ............ 204/192.38 |
| 2008/0020138 A1* | 1/2008 | Ramm et al. ............ 427/248.1 |

FOREIGN PATENT DOCUMENTS

| | | |
|---|---|---|
| JP | 10226875 A | 8/1998 |
| JP | 2000328236 A | 11/2000 |
| JP | 2001040467 A | 2/2001 |
| JP | 2004523658 A | 8/2004 |
| JP | 2005290405 A | 10/2005 |
| JP | 2006510803 A | 3/2006 |
| WO | 99/41425 A | 8/1999 |
| WO | 2004/057642 A | 7/2007 |

* cited by examiner

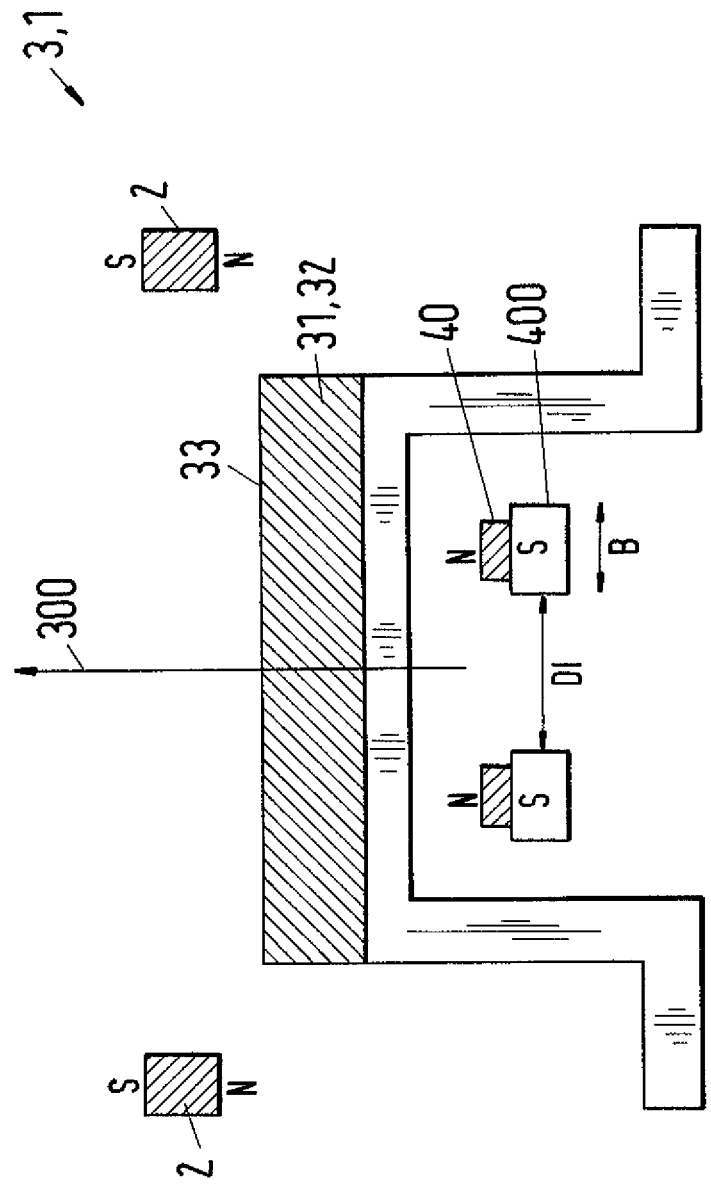

VACUUM ARC VAPORISATION SOURCE AND ALSO A VACUUM ARC VAPORISATION CHAMBER WITH A VACUUM ARC VAPORISATION SOURCE

CROSS-REFERENCE TO RELATED APPLICATIONS

The present application claims priority under 35 U.S.C. §119 of European Patent Application No. 07106345.7 filed on Apr. 17, 2007, and is a 371 nationalization of PCT/EP2008/052844, the disclosures of which is expressly incorporated by reference herein in their entirety.

The invention relates to a vacuum arc vaporisation source, and also to a vacuum arc vaporisation chamber with a vacuum arc vaporisation source in accordance with the pre-characterising part of the independent claims 1 and 24.

A plurality of vacuum arc vaporisation installations are known from the prior art in which an arc discharge with an vaporisation material which is formed as a cathode, is produced in a vacuum chamber, through which the vaporisation material is vaporised by means of the energy of an arc and is ionised completely or partially in order to deposit thin films on a substrate.

In this arrangement films, which are deposited in this way can fulfil quite different functions. They can satisfy purely decorative purposes, can protect against wear or corrosion or can screen the surfaces of workpieces against the extreme effects of heat. Frequently the layers applied by means of arc evaporation simultaneously satisfy two or more, frequently different functions. It has, accordingly, been known for a long time to also apply multi-layer layer systems of the same or different composition.

Thus, for example, a method and an apparatus for the manufacture of multiple component layers is disclosed in DD 293145, in which a cathode comprising a plurality of a working surfaces is used, at which a magnetic field which can be altered with regard to place and time is provided, so that the cathode spot is forced onto the different working surfaces in accordance with the layer composition required.

A method related to this and also a corresponding apparatus is shown in DD 285 463 in order to guarantee a more uniform erosion off of the cathodes, which can also be advantageously used in the application of simple single layer systems for example.

No matter whether single layer of multi-layer layer systems are to be applied, all vacuum arc vaporisation plants of this kind or similar known from the prior art have different and decisive disadvantages.

Thus in the known arc vaporisers, melted particles with a diameter of up to a few micrometers are unavoidably formed which are considerably larger than the actually desired small, vaporised and ionised particles. These considerably larger particles are then mixed into the layers or thin films which leads to a deterioration of the surface structure, the strength, the adhesive strength, the tribological characteristics etc. of the films and in single and multi-layered layers can lead to an irregular composition of the applied layers.

In order to prevent this it is proposed in JP 2 194 167 to arrange a coil coaxial to the vaporisation surface with an air core between the vaporisation surface and a substrate. In this way electrons in a plasma are forced around the magnetic lines of force generated by the coil and flow along the lines of force while they carry out a rotational movement so that the plasma reaches the substrate. This induction effect naturally does not work on neutral melted particles. A further decisive disadvantage of this arrangement is that the coil is arranged in an intermediate position between the substrate and the vaporisation surface which leads to the magnetic field produced by the coil being directed radially inwardly with respect to the vaporisation surface. This has the result that the arc tends to be conveyed closer to the middle of the cathode so that this is used unevenly. Moreover, further vaporisation sources which can in certain cases be additionally arranged in the chamber, for example to manufacture multiple-layer layers or layers of complicated composition, are negatively influenced by the magnetic coil which can naturally lead to undesired effects.

It is thus proposed in the European patent application EP 0 495 447 to provide an additional magnetic field source on the rear side of the cathode body, the source being coupled to a motor so that a magnetic field produced from the additional magnetic field source can be varied with regard to place and with regard to time, so that the arc can be guided intentionally on the vaporisation surface and thus a more uniform erosion of the cathode can be guaranteed. The disadvantage of this arrangement is naturally, that the construction is very complicated in assembly, operation and servicing. Furthermore, scattering fields are likewise produced which in addition vary with regard to place and with regard to time and adjacent vaporisation cathodes can be exposed to undesired influences.

For the solution of these problems known from the prior art it is proposed in DE 600 19 821 to arrange a ring-shaped magnetic field generating source in such a way that it surrounds the vaporisation material and the vaporisation surface is provided between the north pole and the south pole of the magnetic field generating source. To this end two magnetic field generating sources, one inner and one outer, are grouped around the arc discharge source. In this arrangement the magnetic field lines of the magnetic field generating source should cross the vaporisation surface at an angle of +/−30° in relation to the normal.

In this connection a disc-shaped magnetic field source is provided in the middle on the underside of the cathode body on the side of the vaporisation cathode facing away from the vaporisation surface, whereby the magnetic field lines of the ring-shaped magnetic field generating source ares intended to be altered in such a way that the arc is guided on the vaporisation surface in such a way that a non-uniform erosion or ablation of the vaporisation surface is prevented. Experience has shown however that a positioning of a magnet in the centre brings about field strengthening precisely in the middle of the cathode surface.

The system is inflexible due to its construction. This means, in particular if permanent magnetic sources are used, the field strength and the field strength distribution at the cathode can not be altered any more in practice. Thus the system can not be adapted to external influences, for example by adjacent magnetic sources, nor to different cathode materials nor to other influences determining the coating process or the erosion process on the cathode.

It is therefore the object of the invention to make available an improved vacuum arc vaporisation source and also an improved arc vaporisation chamber which realises magnetic field enhancement in the direction towards the substrates in particular, simultaneously guarantees an enhancement of the magnetic field at the inner cathode surface so that on the one hand a homogenous course can be achieved via the cathode erosion and a advantageous course of the magnetic field is achieved at the cathode surface so that an optimum acceleration of the arc is possible.

An excessive field enhancement in the middle of the cathode surface should be avoided in this arrangement.

In this arrangement the improved system should at the same time be very flexible with respect to the possibilities of the changes of the magnetic field geometry so that in a simple and economic manner the arc vaporisation source, or rather the arc vaporisation chamber equipped with it, can be ideally adapted to changing requirements at any time.

The subjects of the invention satisfying these objects are characterised by the features of the independent claims 1 and 24.

The respective dependent claims relate to particularly advantageous embodiments of the invention.

The invention thus relates to a vacuum arc vaporisation source, including a ring-like magnetic field source and a cathode body with an vaporisation material as a cathode for the production of an arc discharge on an vaporisation surface of the cathode. In this arrangement the cathode body is bounded in the axial direction in a first axial direction by a cathode base and in a second axial direction by the vaporisation surface and the ring-like magnetic field source is arranged polarised parallel to or anti-parallel to a surface normal of the vaporisation surface and concentric to a surface normal of the vaporisation surface. In accordance with the invention a magnetic field enhancement ring is arranged on a side remote from the vaporisation surface at a pre-determinable second spacing in front of the cathode base.

Of importance to the invention is thus the combination of a magnetic field enhancement ring on the side remote from the vaporisation surface with the ring-like magnetic field source arranged in the region of the vaporisation surface.

In this arrangement the magnetic field source can be arranged concentric to the surface normal in such a way that the vaporisation surface lies between a north pole and a south pole of the magnetic field source. I.e., in a very special embodiment the ring-like magnetic field source surrounds the vaporisation surface of the cathode for example in such a way that the vaporisation surface has approximately the same distance to the south pole of the ring-like magnetic field source as it does to the north pole of the ring-like magnetic field source.

In an embodiment which is very important in practice the ring-like magnetic field source is however spaced at the pre-determinable first spacing from the vaporisation surface at a side of the cathode body remote from the cathode base.

It has namely, surprisingly been shown that, if the vaporisation surface is not arranged between the north pole and the south pole of the ring-like magnetic field source, but rather is spaced from this at a pre-determinable distance, an even more ideal field distribution in the region of the cathode body can be achieved, in particular in the region of the vaporisation surface. Nevertheless special examples of use can exist in which an arrangement of the vaporisation source between the north pole and the south pole of the ring-like magnetic field source is to be preferred.

For the predominant number of uses it has been shown, surprisingly, that due to the fact that if, on the one hand, the vaporisation surface is not arranged between the north pole and the south pole of the ring-like magnetic field source, but rather is spaced from this at a pre-determinable distance and on the other hand, instead of a known disc-shaped magnetic source, arranged in the middle underneath the cathode body, a ring-like magnetic field enhancing ring is provided, an ideal field distribution in the region of the cathode body can be achieved, in particular in the region of the vaporisation surface, which does not display the disadvantages known from the prior art.

By means of the arrangement in accordance with the invention a considerably more uniform field in comparison with the prior art is produced in particular in the region of the middle of the cathode. As a result the cathode is used very uniformly in other words erodes across the whole vaporisation surface, with this positive effect not taking place to the detriment of the magnetic field components parallel to the vaporisation surface, which serve primarily for the acceleration of the movement of the arc. This means that, ultimately, the guiding of the arc on the vaporisation surface is improved considerably which among other things leads to a far more uniform erosion of the cathode and to considerably better coating results.

Furthermore, at the same time, the magnetic field is increased in the direction towards the substrate, which ultimately has a very positive effect on the coating quality during the coating of a substrate.

This is achieved by the positioning of the magnetic field source in the cathode surface or at a distance from this in the direction of the substrate.

Moreover, the arc vaporisation source or rather the arc vaporisation chamber in accordance with the present invention is very flexible due to its construction. This means that the field strength and the field strength distribution at the cathode can be changed very simply, even if permanent magnet sources are used. Thus the system in accordance with the invention can easily be adapted to a change in external influences, for example due to adjacent magnetic sources, to other current densities in the arc, to different cathode materials, or to other influences determining the coating process or erosion process at the cathode.

In this connection the modular method of construction of the arc vaporisation source in accordance with the present invention is particularly advantageous. An arc vaporisation source in accordance with the invention preferably consists of a separate system of inner magnets and the vaporiser base plate with the second magnet system, so that the magnet systems can be manipulated or altered or exchanged separately and independently of one another.

In a preferred embodiment the magnetic field enhancement ring is arranged parallel to or anti-parallel to the surface normal and/or concentric to the surface normal.

In an embodiment which is particularly important for practical use, in addition to the magnetic field enhancing ring, at least one magnetic correction ring can be arranged on the side remote from the vaporisation surface at a pre-determinable third distance in front of the cathode base. By means of the magnetic correction ring it is possible to effect a fine tuning of the geometry of the magnetic field distribution, so that an ideal guidance of the arc on the vaporisation surface is guaranteed even in complicated cases.

It will be understood that, depending on the desired magnetic field distribution or the spatial distribution of the course of the magnetic field, the magnetic correction ring can be polarised parallel to or anti-parallel to the surface normal and/or is preferably arranged concentric to the surface normal.

It is also possible, for certain special cases, that the magnetic field enhancement ring and/or the magnetic correction ring is not aligned concentric to the surface normal and/or the magnetic field enhancement ring and/or the magnetic correction ring has a non-circular cross-sectional area. Highly complex magnetic field geometries can be constructed in the region of the cathode body using arrangements such as these, so that for example when coating a plurality of substrates the magnetic fields can be of different strengths in the direction towards the different substrates, so that different substrates can be coated at the same time from the same source under different conditions. Or it can, for example, be used advantageously when the cathode includes different regions with different coating materials, so that a correspondingly complicated guiding of the arc on the vaporisation surface is necessary.

Embodiments of vacuum arc vaporisation sources in accordance with the invention in which the first distance and/or the second distance and/or the third distance can be adjusted, in particular can be controlled and/or regulated in dependence on the vaporisation material and/or on the state of erosion of the cathode and/or in dependence on another operating parameter of the vacuum arc vaporisation source are also very significant for practical use, as a result of which the vacuum arc vaporisation source obtains a flexibility not known hitherto in relation to the all possible operating conditions and demands on the process.

The first distance and/or the second distance and/or the third distance can preferably lie in a range between 0 mm to 200 mm in this connection. As already mentioned above it is definitive for the invention in this arrangement that the vaporisation surface does not come to lie directly between the north pole and the south pole of one of the magnetic field sources that is used because then the ideal field distribution geometry in accordance with the invention can not be achieved.

The different magnetic field sources already introduced in detail above can be realised in this arrangement by means of different concepts. In a particularly preferred embodiment the ring-like magnetic field source and/or the magnetic field enhancement ring and/or the magnetic correction ring can include a plurality of permanent magnets aligned essentially parallel to the surface normal. Essentially parallel means in this connection that the angle between the surface normal of the vaporisation surface and a polarisation direction of the permanent magnets is between 0° and 20° for example, preferably 0° however.

In this arrangement the ring-like magnetic field source and/or the magnetic field enhancement ring and/or the magnetic correction ring can also include a ring magnet, which is preferably polarised essentially parallel to the surface normal of the vaporisation surface.

In another embodiment the ring-like magnetic field source and/or the magnetic field enhancement ring and/or the magnetic correction ring can include an electromagnet. When using an electromagnet the strength and geometry of the magnetic field lines can naturally, be adjusted to special requirements particularly flexibly.

On a general level, in embodiments which are very important for practical use, a magnetic field strength of the ring-like magnetic field source and/or a magnetic field strength of the magnetic field enhancement ring and/or a magnetic field strength of the magnetic correction ring can be altered and/or controlled and/or regulated, in particular in dependence on the vaporisation material and/or on the erosion state of the cathode and/or can be controlled or regulated in dependence on another operating parameter of the vacuum arc vaporisation source.

Depending on the special use the magnetic field strength can be controlled and/or regulated by a control and/or a regulation of an electric current through an electromagnet of the ring-like magnetic field source and/or of the magnetic field enhancement ring and/or of the magnetic correction ring.

If ring magnets are used then the magnetic field strength can be adjusted by an exchange of the ring magnet and/or by an additional ring magnet and/or by removal of a ring magnet of the ring-like magnetic field source and/or of the magnetic field enhancement ring and/or of the magnetic correction ring.

Such embodiments in accordance with the invention have proved to be particularly advantageous for many practical uses in which the magnetic field strength can be adjusted by an alteration of a number of the plurality of the permanent magnets aligned parallel to the surface normal of the ring-like magnetic field source and/or of the magnetic field enhancement ring and/or of the magnetic correction ring.

As far as the magnetic polarisation directions of the different magnetic field sources are concerned, the ring-like magnetic field source and/or the magnetic field enhancement ring and/or the magnetic correction ring can be polarised in the same direction in relation to the surface normal or, in another case, the ring-like magnetic field source and/or the magnetic field enhancement ring and/or the magnetic correction ring can be polarised in opposition in relation to the surface normal.

As is known per se from the prior art, a cooling system, in particular a water cooling system, is provided for the cooling of the arc vaporisation source.

The ring-like magnetic field source and/or the magnetic field enhancement ring and/or the magnetic correction ring can in particular include a high temperature magnet, in particular a high temperature magnet made of SmCo, so that considerably higher operating temperatures can be achieved using an arc vaporisation source or work can be carried out on the vaporisation cathode using a reduced cooling power. In special cases a cooling can even be dispensed with.

The ring-like magnetic field source is preferably arranged on a mounting block in a manner known per se, in particular on a mounting block made of copper and a BN insulation is provided between the mounting bock and the cathode for the restriction of the arc discharge to the vaporisation surface of the cathode.

In this connection the mounting block can include a primary anode for the ignition and maintenance of the arc discharge, and the primary anode can be insulated electrically relative to the mounting block; however, in another embodiment it does not necessarily have to be insulated electrically relative to the mounting block.

The BN insulation can be in touching contact with the cathode for the ignition and maintenance of the arc discharge, an arrangement which is known per se from the prior art.

In order to achieve an improved ignition of the arc, the arc vaporisation source can include a pivotable trigger device for the ignition of the arc discharge which is in particular linearly movably or rotatably arranged.

The invention further relates to arc vaporisation chamber including an arc vaporisation source as is described further above and in the following with the help of the drawings.

As is known in principle from the prior art, the cathode body of an arc vaporisation source in accordance with the invention and the arc vaporisation chamber itself can be connected to an electrical power supply unit, with the arc vaporisation chamber being connected electrically as an anode in relation to the cathode.

The arc vaporisation chamber can also, in a manner known per se to the person averagely skilled in the art, be electrically connected via an electrical resistance to a primary anode electrically insulated from the mounting block or a primary anode electrically insulated from the mounting block is connected to a positive pole of an auxiliary electrical supply unit, with the arc vaporisation chamber being connected to a negative pole of the auxiliary electrical supply unit.

The electrical energy supply unit and/or the auxiliary electrical supply unit can in this arrangement be a direct current electrical energy source and, in a different embodiment, the electrical energy supply unit and/or the auxiliary electrical supply unit can also be a pulsed electrical energy source or any other suitable electrical energy source.

Usual parameters for the operation of the arc source in accordance with the invention in continuous DC operation are operating voltages of the energy source in the range from 10-600 V and currents in the range from 30 to 500 A. If pulsed discharges are worked with, pulse currents of up to a few 1000 A can be applied in such a way that the cooling of the source is still adequate to be able to dissipate the time averaged energy by cooling. The pulse frequencies of the energy source can lie in the range of a few Hz up to a few 10 kHz. The auxiliary source is operated with similar parameters.

The working pressures at which the vaporisers are used range from high vacuum up to 50 Pa.

Figure 2A:
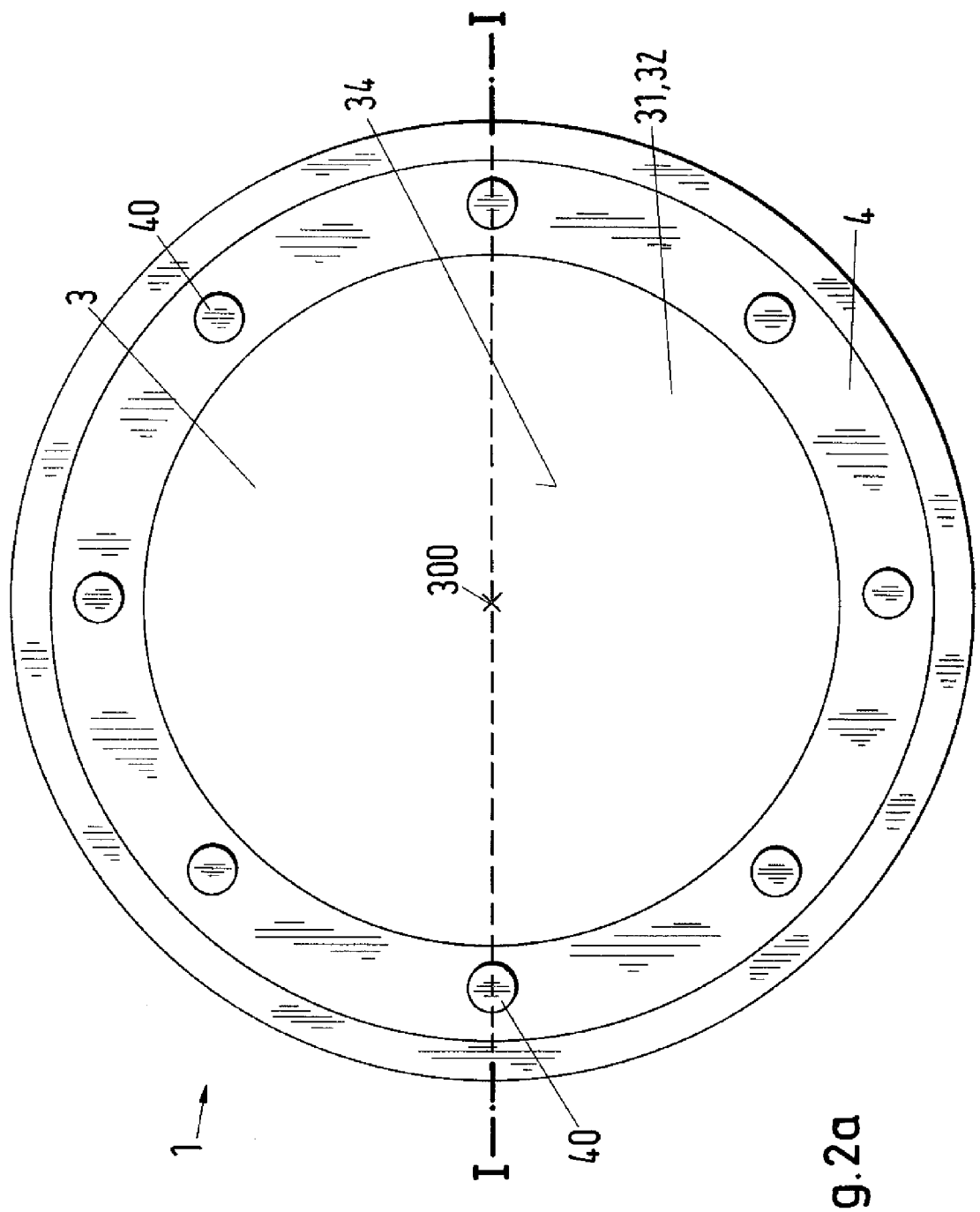

The invention is explained in the following with the help of the schematic drawing, which shows:

FIG. 1 a first embodiment of a vacuum arc vaporisation source in accordance with the invention FIG. 2a a rear view of a vacuum arc vaporisation source with a plurality of permanent magnets;

FIG. 2b a section along the section line I-I in accordance with FIG. 2a

Figure 3:
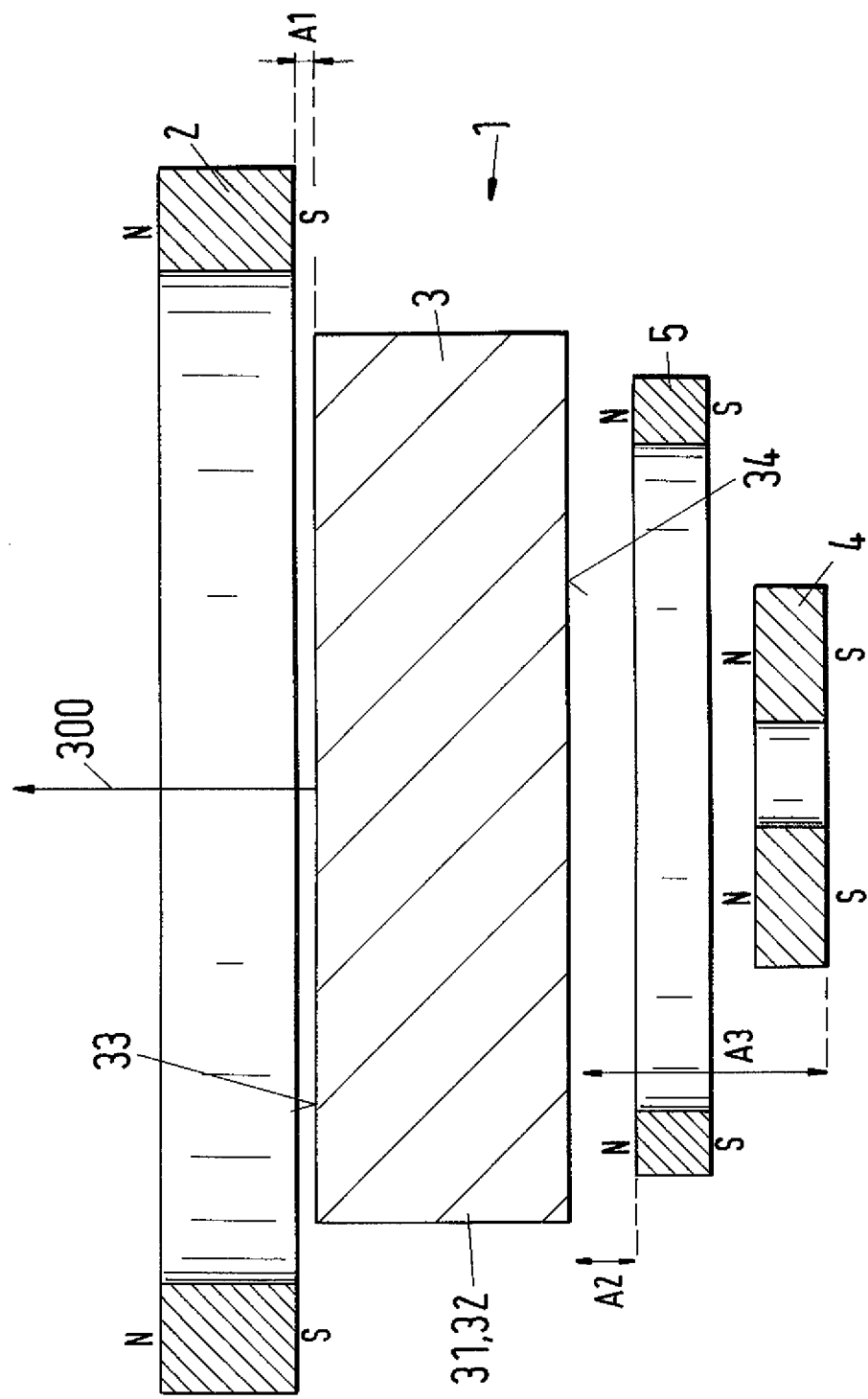
Figure 4:
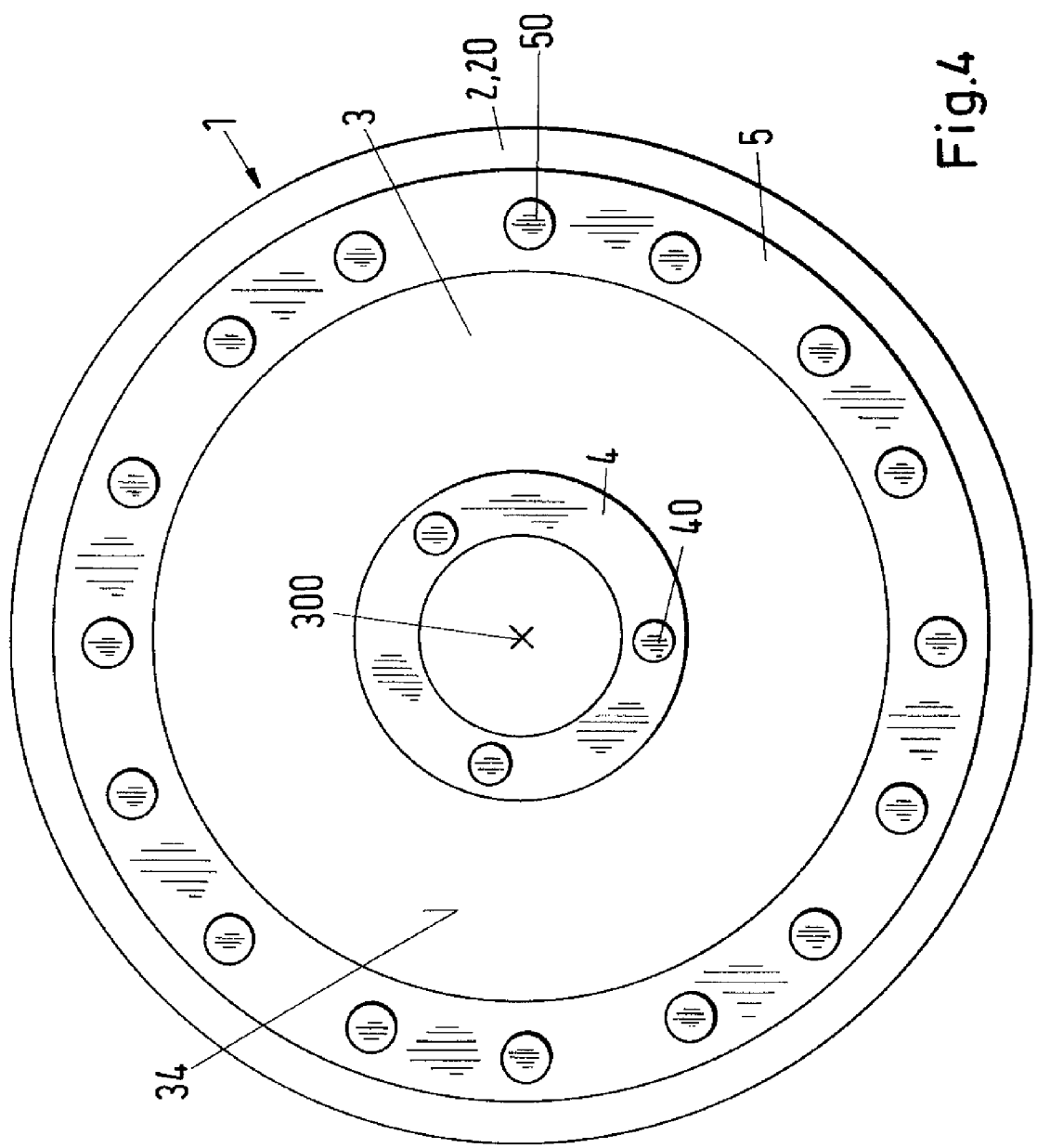
Figure 5:
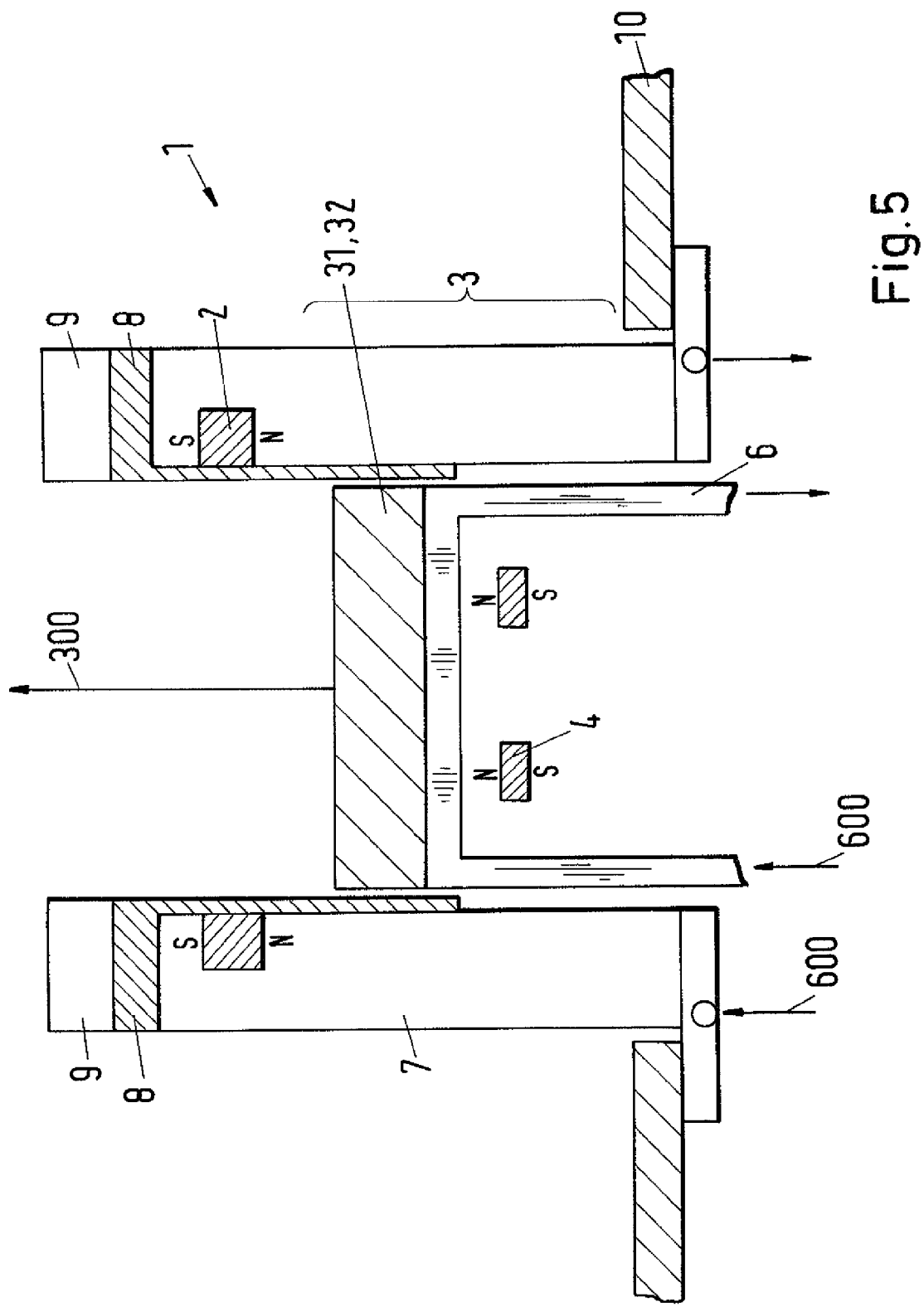
Figure 6:
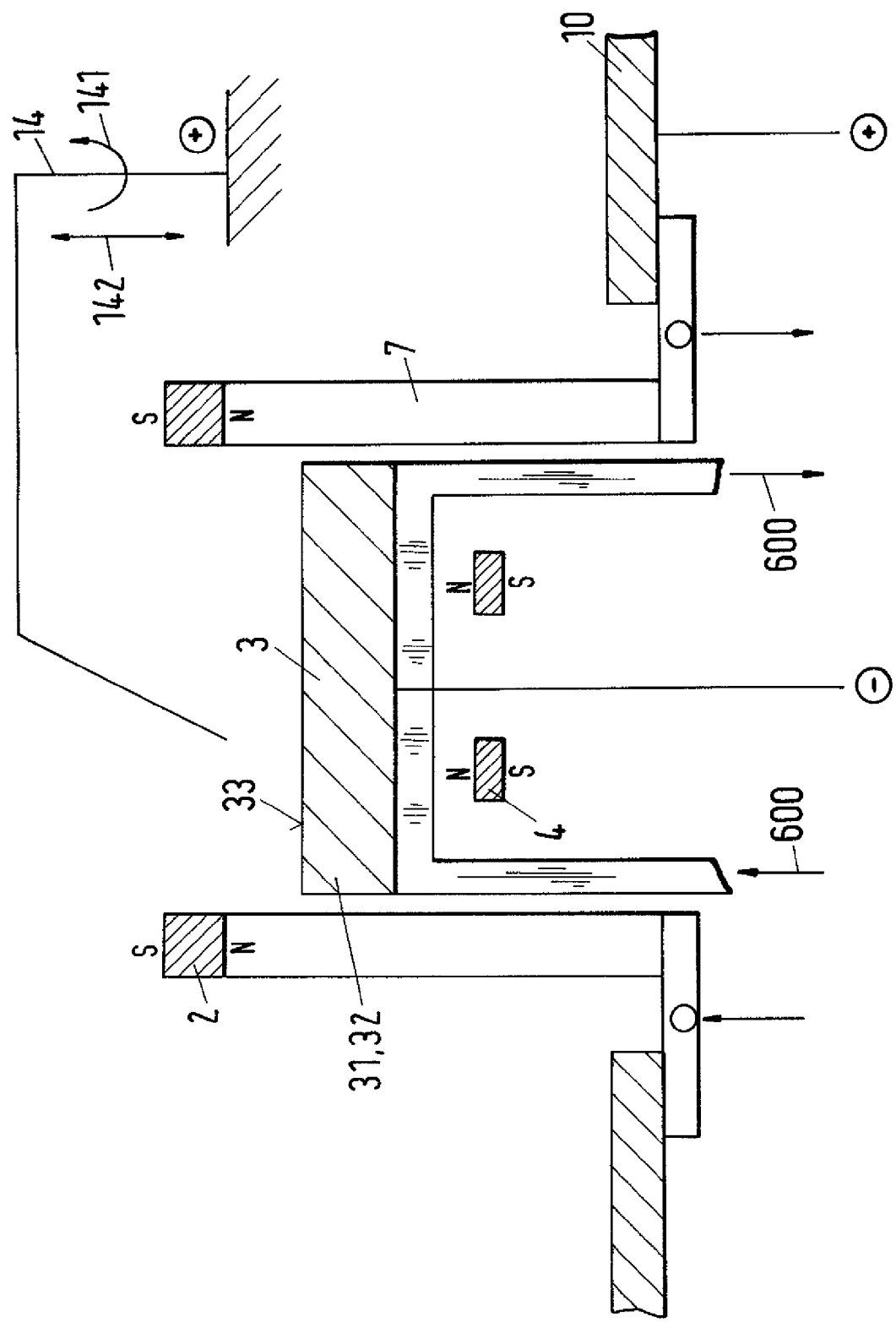
Figure 7:
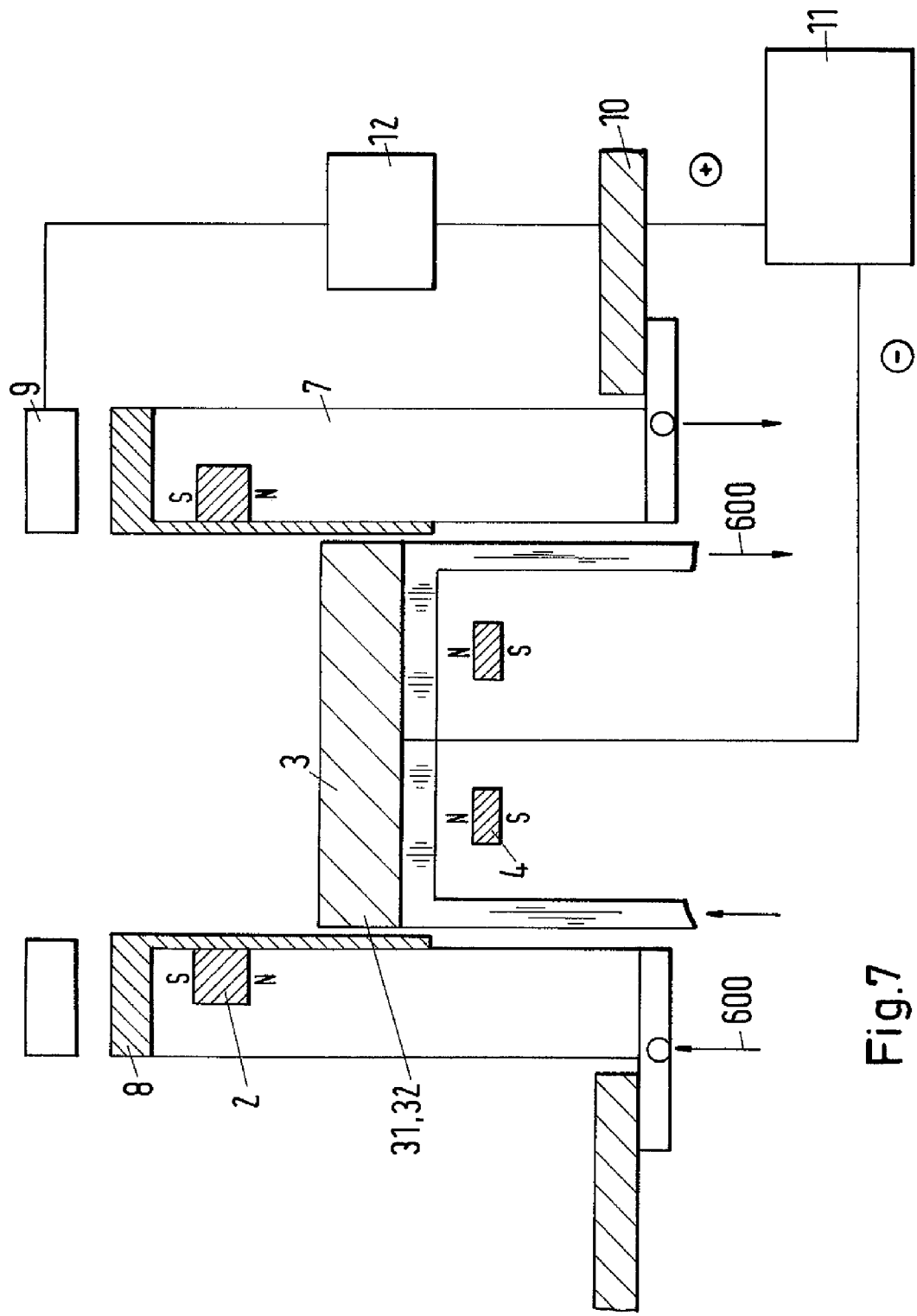
Figure 8:
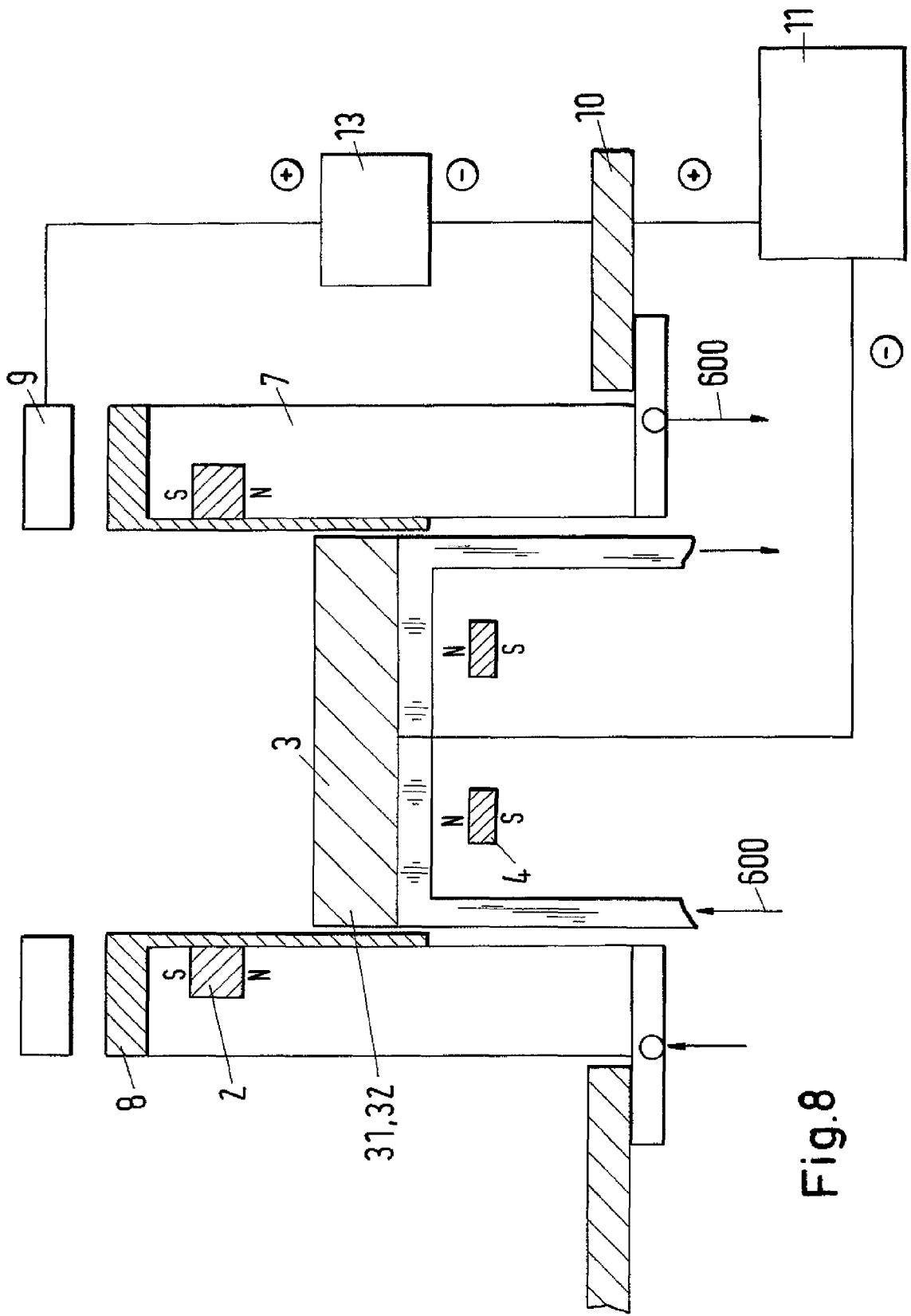
Figure 9:
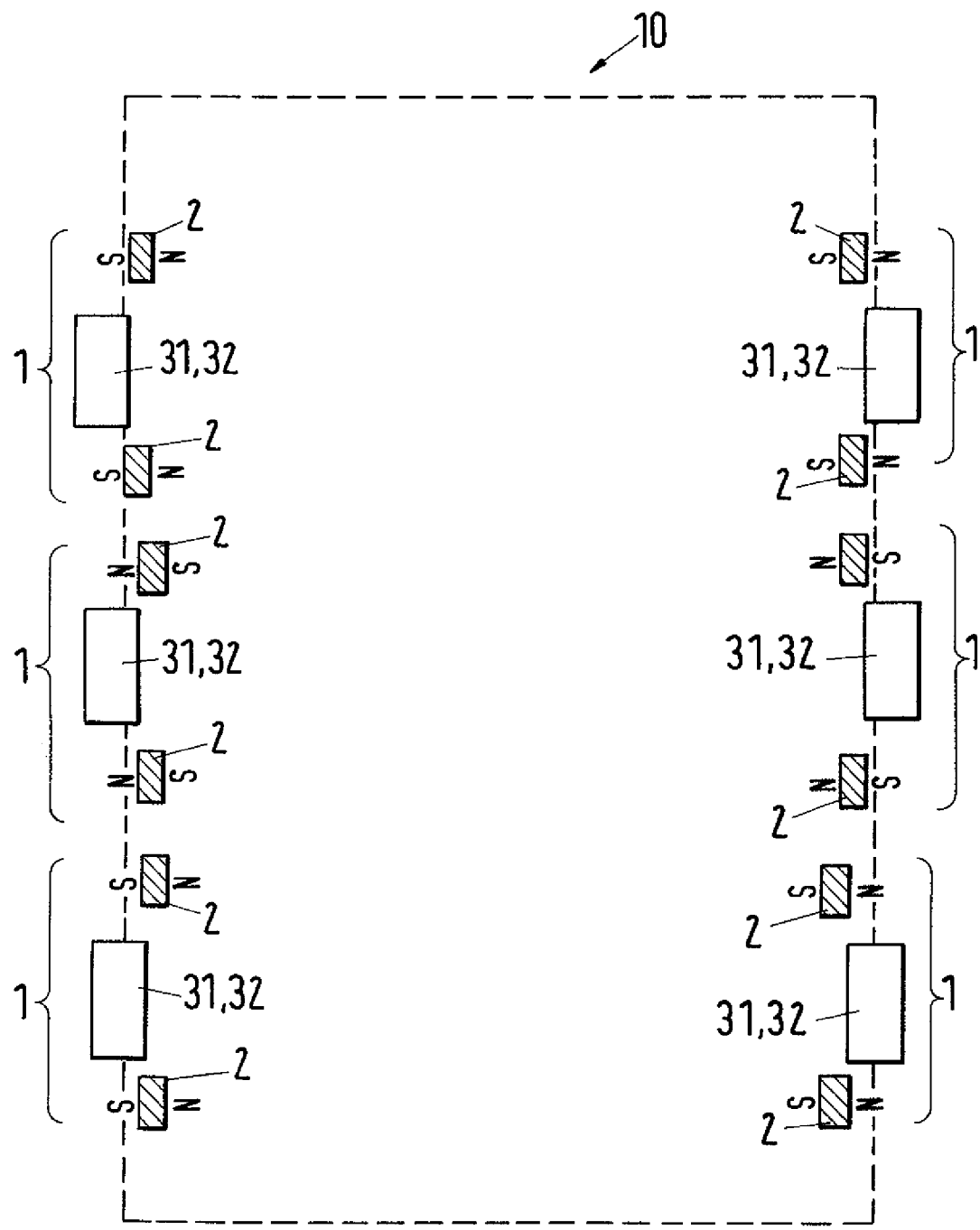
Figure 10:
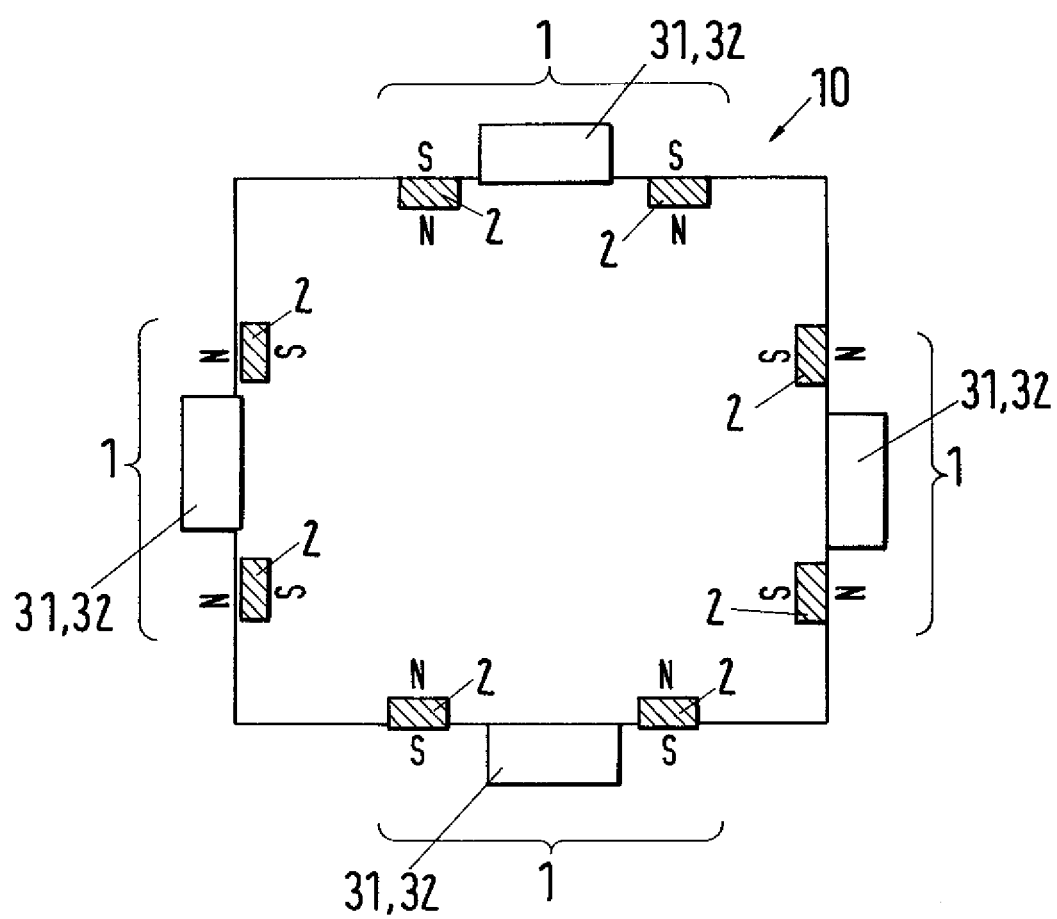

FIG. 3 an embodiment in accordance with the invention of a vacuum arc vaporisation source with a magnetic corrector ring;

FIG. 4 a rear view of another embodiment in accordance with FIG. 3 with a plurality of permanent magnets;

FIG. 5 an embodiment with BN insulation;

FIG. 6 an arc vaporisation chamber with a pivotable trigger device;

FIG. 7 an arc vaporisation chamber with an insulated primary anode and resistance;

FIG. 8 an embodiment in accordance with FIG. 7 with an auxiliary unit;

FIG. 9 a first arc vaporisation chamber with a plurality of arc vaporisation sources;

FIG. 10 a second arc vaporisation chamber with a plurality of arc vaporisation sources.

In FIG. 1 a first simple embodiment of a vacuum arc vaporisation source, which is designated as a whole with the reference numeral 1 in the following, is illustrated schematically in section in the built-in state in an arc vaporisation chamber in accordance with the invention.

The vacuum arc vaporisation source 1 in accordance with the invention includes a ring-like or annular magnetic field source 2 and a cathode body 3 with an vaporisation material 31 as a cathode 32 for the generation of an arc discharge on an vaporisation surface 33 of the cathode 32. The cathode body 3 is bounded in the axial direction by a cathode base 34 in a first axial direction and by the vaporisation surface 33 in a second axial direction. The ring-like magnetic field source 2 is arranged concentrically and polarised parallel to or anti-parallel to a surface normal 300 of the vaporisation surface 33 spaced at a predeterminable first distance A1 on a side of the cathode body 3 remote from the cathode base 34. In accordance with the present invention a magnetic field enhancement ring 4 is arranged on a side remote from the vaporisation surface 33 at a pre-determinable second spacing A2 in front of the cathode base 34.

In this arrangement an inner diameter D1 of the magnetic field enhancement ring 4 amounts to approximately 3%, in particular up to 10%, preferably up to 15%, especially up to 50% or more than 50% of a diameter of the cathode 32. If, for example a cathode 32 with a diameter of 100 mm is used, then the inner diameter D1 of the magnetic enhancement ring 4 amounts to 3 mm for example, in particular up to 10 mm, preferably up to 15 mm and especially up to 50 mm or more.

A breadth B of the magnetic field enhancement ring 4 can amount to approximately 2%, in particular up to 5%, preferably up to 10% or more than 10% of a diameter of the cathode 32. If one presumes a cathode 32 with a diameter of 100 mm on the other hand, the breadth B of the magnetic enhancement field 4 can then amount to 2 mm for example, in particular up to 5 mm and preferably up to 10 mm or more.

The specific geometry of the magnetic enhancement ring 4 can in this connection depend on the special demands on the specific coating task, the geometry and/or on the size of the coating arrangements, on the cathode material or on other parameters influencing the coating process.

In this arrangement the vacuum arc vaporisation source is installed in an arc vaporisation chamber 10 in a manner known per se and provided with a cooling system 6 for cooling, through which, as is indicated by the arrow 600, cooling water 600 flows for the cooling. The magnetic field produced in total by the ring-like magnetic field source 2 and the magnetic enhancement ring 4 is symbolised in a greatly simplified schematic illustration by the magnetic field lines 200, which do not reproduce the actual geometry of the magnetic field and which, for example, influence the movement of the electrons $e^-$.

In FIG. 2a a rear view, i.e. a view onto the cathode base 34 of a vacuum arc vaporisation source 1 is illustrated, in which the magnetic enhancement ring 4 is essentially formed by a plurality of permanent magnets 40. The permanent magnets 40 of the magnetic field enhancement ring 4 are arranged on the side remote from the vaporisation surface 33 at a predetermined second spacing A2 in front of the cathode base 34 and aligned with respect to their magnetic polarisation essentially parallel to or anti-parallel to the surface normal 300. It will be understood that all permanent magnets 40 can, for example, be aligned parallel or parallel with respect to the surfaces 300, or that some of the permanent magnets 40 can be aligned parallel and some other ones of the permanent magnets 40 anti-parallel with respect to the surface normal, for example in order to realise particular magnet geometries in the region of the cathode body 3.

It will be understood further that both the magnetic field enhancement ring 4 and/or the magnetic correction ring 5 and/or the magnetic field source 2 can, for example, be formed by a ferritic ring or a ferromagnetic ring or a non-magnetic ring, on which, for example, the plurality of permanent magnets (20, 40, 50) aligned parallel to the surface normal 300 is arranged, with it being clear that the ferritic ring or the ferromagnetic ring or the non-magnetic ring can also be omitted.

In an embodiment which is important for practical use the magnet enhancement ring 4 is formed, for example, by a ferritic ring on which three permanent magnets 40 are arranged at a spacing of 120°.

The above also applies of course to possible arrangements of the permanent magnets 20 of the ring-like magnetic field source 2 and to the permanent magnets 50 of the magnetic correction ring 5, which will be described in more detail further below.

For purposes of clarification a section along the section line I-I through the cathode body 3 in accordance with FIG. 2a is illustrated in FIG. 2b. The ring-like magnetic field source which is arranged directly above the vaporisation surface 33 concentrically to the surface normal 300 can be seen. In the example of FIG. 2b the ring-like magnetic field source 2 is a ring magnet 2. It is understood that in a different embodiment the ring magnet 2 can also be formed from a plurality of individual ring magnets 2 and/or can be formed by a plurality of permanent magnets 20 and/or can be realised by an electromagnet 2.

The magnetic field enhancement ring 4 includes a magnetic or non-magnetic mounting ring in which the permanent magnets 40 are preferably provided detachably so that these can be exchanged easily or, depending on the requirements, the total number of the permanent magnets 40 can be varied, so that the strength and/or the geometry of the magnetic field caused by the magnetic field enhancement ring 4 can be varied very simply.

A further embodiment in accordance with the invention of a vacuum arc vaporisation source 1 with a magnetic correction ring 5 is illustrated in FIG. 3, partly in section, which is particularly important for practical use. The ring-like magnetic source 2 is spaced at a distance A1 from the vaporisation surface 33 of the cathode 3.

The magnetic correction ring 5 is placed at a spacing A2 somewhat nearer to the cathode base 34 than the magnetic enhancement ring 4, which is spaced at a somewhat larger spacing A3 from the cathode base 34. There are also means present, which are known per se to the person averagely skilled in the art, but which are not shown in more detail, which allow the spacings A1, A2 and A3 to be altered in suitable manner depending on the requirement.

In the example of FIG. 3 the magnetic field source 2, the magnetic field enhancement ring 4 and the magnetic correction ring 5 are polarised magnetically in relation to the surface normal in the same sense. It will be understood that the aforementioned magnetic rings in other embodiments can also be arranged in any other suitable combination in relation to the surface normal 300. Depending on requirements this can vary and can for example be determined by the relative strength of the magnets 2, 4, 5 used and/or by the special geometrical arrangement in relation to the cathode body 3 or by other specifications as regards apparatus or technical procedure.

FIG. 4 shows a rear view of another embodiment in accordance with FIG. 3 in which the magnetic enhancement ring 4 and the magnetic correction ring 5 is formed by a plurality of permanent magnets 40, 50. In the example of FIG. 4 the magnetic enhancement ring 4 and the magnetic correction ring 5 have the same distance from the cathode base 34.

An embodiment is schematically illustrated in FIG. 5 wherein the anode 9 is electrically insulated via a BN-insulation 8, in other words via an electrically insulating layer which contains boron nitride, i.e. BN as its essential component, relative to an electrically conducting mounting block 7 which can be composed of copper for example. This arrangement with a BN layer is known per se and serves primarily to prevent a crosstalk of the arc onto the anode 9 or onto the mounting block 7. At the same time the anode 9 can serve for the ignition and maintenance of the arc during a coating process.

In the embodiment of FIG. 6 an arc vaporisation chamber 10 is schematically illustrated with a pivotable trigger device 14, wherein the trigger device 14 is electrically connected to a positive potential as an anode relative to a cathode body 3 lying at a negative electrical potential. The trigger device 14 serves in a manner known per se for the ignition and maintenance of an arc and is, as illustrated by the arrow 141, not only able to be pivoted about an axis of rotation but also able to be altered along the arrow 142 linearly with respect to the distance to the vaporisation surface 33.

FIG. 7 and FIG. 8 each show an embodiment of an arc vaporisation chamber in accordance with the invention with an insulated primary anode. The arc vaporisation chamber 10 is connected to a positive pole of an energy supply unit 11 and the cathode body 3 is connected to a negative pole of the energy supply unit 11. I.e. the arc vaporisation chamber 10 is connected electrically as an anode relative to the cathode body 3.

The anode 9 is respectively designed as a primary anode 9 electrically insulated from the mounting block 7. In this connection, in the example of FIG. 7, the primary anode 9 is electrically coupled via an electrical resistance 12 with the arc vaporisation chamber 10, whereas in the example of FIG. 8 the primary anode 9 is coupled with the arc vaporisation chamber 10 via an auxiliary electrical supply unit 13 in a manner known per se.

For this kind of electrical arrangement of mounting block 7, electrical energy supply unit 11 and primary anode 9 it is crucial that a potential separation is established between the arc vaporisation chamber 10 and the anode 9, so that a primary anode 9 and a secondary anode are created with the secondary anode being formed by the arc vaporisation chamber 10 itself.

It will be understood that potential separation between the primary anode 9 and the arc vaporisation chamber 10 can also be realised by the fact that the auxiliary electrical supply unit 13 or the electrical resistance 12 are arranged between the mounting block 7 and the arc vaporisation chamber 12, with the primary anode 9 then being in electrical connection with the mounting block 7 or the mounting block 7 forms or directly includes the primary anode 9.

In this connection the theoretical and practical fundamental principles of the electrical circuit between the arc vaporisation chamber 10 and the vacuum arc vaporisation source 9 are known per se to the person averagely skilled in the art and thus do not need to be described in further detail at this point.

As an example two more special embodiments of arc vaporisation chambers 10 are shown in FIG. 9 and FIG. 10, which are of particular significance for practical use. In this the arrangement of the polarities of individual vaporisers are in particular described as an example for the case when a plurality of vaporisers are installed into the arc vaporisation chamber 10.

On the basis of FIG. 9 and FIG. 10 the interaction between the magnetic field lines in the presence of a plurality of arc vaporisation sources 1 in one and the same arc vaporisation chamber 10 can be demonstrated particularly clearly. Depending on the demands of a concrete coating task, the variant in accordance with FIG. 9 or in accordance with FIG. 10 can be more suitable for example. It shall be understood that other arrangements of arc vaporisation sources in an arc vaporisation chamber 10 are naturally also covered by the invention.

FIG. 9 shows an arrangement with a first vaporisation chamber 10 with a plurality of arc vaporisation sources 1, which lead to a field enhancement of oppositely disposed arc vaporisation sources 1 transversly through the arc vaporisation chamber 10. In accordance with the illustration arc vaporisation sources 1 lying one underneath the other are arranged alternately with respect to their polarity. Due to the arrangement of the magnetic field sources 2 with attenuating polarity (for example the N-pole lies opposite the S-pole) magnetic field lines are closed trans-versely through the arc vaporisation chamber 10. This leads to a favourable influencing of the excitation of reactive gases in the vicinity of the substrates which are to be coated, which are not illustrated in FIG. 9 and FIG. 10 for reasons of clarity.

The layer growth in the vicinity of the substrates which are to be coated is positively influenced by the arrangement of FIG. 9, through the excitation of reactive gases.

FIG. 10 shows a further variant of an arc vaporisation chamber 10 with a plurality of arc vaporisation sources 1. In this connection, the vaporiser 1 is located in a plane around the chamber 10. This reciprocal arrangement has the effect that a field enhancement in accordance with FIG. 9 does not arise transversely through the chamber 10 but rather a closed magnetic field arises between the vaporisers 1. This construction is to be preferred when an additional stimulation of the reactivity of the process gases in the vicinity of the substrates is not desired, for example when layers are to be deposited in which a small proportion of reactive gases is desired in the layers.

It shall be understood that the described embodiments are to be understood as mere examples and the scope of protection is not limited to the explicitly described embodiments. In particular each suitable combination of embodiments is likewise included by the invention.

In this connection an arc vaporisation source in accordance with the invention can be used in a versatile manner for the coating of a variety of workpieces; using the usual reactive gases for example for the manufacture of nitridic, carbidic, carbonitridic or oxy-nitridic layers and also for the manufacture of oxide layers or carbooxy-nitridic layers or all other layers which can be manufactured advantageously with an arc vaporisation source.

In the following a few practical methods for the adjustment of the magnetic fields will be disclosed depending on the vaporisation task.

The ring-like magnetic field source makes a selection of the number of the magnets possible and also makes possible the determining of their relative position A1 through the solid construction of the mounting plate with bores for magazine storage. An anode is then screwed onto the bored holes if necessary.

The magnetic field enhancement ring and also the correction ring can be exchanged simply since the space behind the cathode base can be designed freely.

The rings themselves are preferably comprised of individual magnets, so that their number and polarity are adjustable. An adjustment of the distances to the cathode base or among each other can be realised using simple mechanical sliding and clamping systems.

The invention claimed is:

1. A vacuum arc vaporization source comprising:
   a ring-shaped magnetic field source;
   a cathode body, comprising a vaporization material, being structured and arranged as a cathode for production of an arc discharge on a vaporization surface of the cathode, wherein the cathode body is axially bounded in a first axial direction by a cathode base and in a second axial direction by the vaporization surface;
   the ring-shaped magnetic field source being arranged polarized parallel to or anti-parallel to a surface normal of the vaporization surface, concentric to the surface normal of the vaporization surface, and spaced at a predeterminable first distance from the vaporization surface on a side of the cathode body remote from the cathode base;
   a magnetic field enhancement ring being arranged on a side of the cathode body remote from the vaporization surface and spaced at a predeterminable second distance from the cathode base,
   wherein an internal diameter of the magnetic field enhancement ring amounts up to 50% of a diameter of the cathode.

2. The vacuum arc vaporization source in accordance with claim 1 wherein the magnetic field enhancement ring is polarised parallel to or anti-parallel to the surface normal and/or is arranged concentric to the surface normal.

3. The vacuum arc vaporization source in accordance with claim 1 wherein a width of the magnetic field enhancement ring is up to 10% of a diameter of the cathode.

4. The vacuum arc vaporization source in accordance with claim 1 wherein at least one magnetic correction ring is arranged on the side remote from the vaporization surface and spaced at a predeterminable third distance from the cathode base.

5. The vacuum arc vaporization source in accordance with claim 4 wherein the magnetic correction ring is arranged polarised parallel to or anti-parallel to the surface normal and/or concentric to the surface normal.

6. The vacuum arc vaporization source in accordance with claim 4 wherein the magnetic field enhancement ring and/or the magnetic correction ring is aligned not concentric to the surface normal and/or the magnetic field enhancement ring and/or the magnetic correction ring has a non-circular cross-sectional area.

7. The vacuum arc vaporization source in accordance with claim 4, wherein the first spacing and /or the second spacing and/or a third spacing is adjustable, in dependence on the vaporization material and/or on a state of erosion of the cathode and/or is controllable or regulatable in dependence on another operating parameter of the vacuum arc vaporization source.

8. The vacuum arc vaporization source in accordance with claim 7 wherein the first spacing and/or the second spacing and/or the third spacing lies in a range from zero to 200 mm.

9. The vacuum arc vaporization source in accordance with claim 1 wherein the ring-shaped magnetic field source and/or the magnetic field enhancement ring and/or a magnetic correction ring includes a plurality of permanent magnets aligned parallel to the surface normal.

10. The vacuum arc vaporization source in accordance with claim 1 wherein the ring-shaped magnetic field source and/or the magnetic field enhancement ring and/or a magnetic correction ring includes a ring magnet.

11. The vacuum arc vaporization source in accordance with claim 1 wherein the ring-shaped magnetic field source and/or the magnetic field enhancement ring and/or a magnetic correction ring includes an electromagnet.

12. The vacuum arc vaporization source in accordance with claim 1 wherein a magnetic field strength of the ring-shaped magnetic field source and/or a magnetic field strength of the magnetic field enhancement ring and/or a magnetic field strength of a magnetic correction ring can be altered and/or controlled and/or regulated, in particular in dependence on the vaporization material and/or on the state of erosion of the cathode and/or can be controlled or regulated in dependence on another operating parameter of the vacuum arc vaporization source.

13. The vacuum arc vaporization source in accordance with claim 12, wherein the magnetic field strength is controllable or regulatable by a control and/or a regulation of an electric current through an electromagnet of the ring-shaped magnetic field source and/or of the magnetic field enhancement ring and/or of the magnetic correction ring.

14. The vacuum arc vaporization source in accordance with claim 12 wherein the magnetic field strength can be adjusted by an exchange of the ring magnet and/or by an additional ring magnet and/or by removal of a ring magnet of the ring-shaped magnetic field source and/or of the magnetic field enhancement ring and/or of the magnetic correction ring.

15. The vacuum arc vaporization source in accordance with claim 12 wherein the magnetic field strength can be adjusted by an alteration of the number of the plurality of the permanent magnets aligned parallel to the surface normal of the ring-shaped magnetic field source and/or of the magnetic field enhancement ring and/or of the magnetic correction ring.

16. The vacuum arc vaporization source in accordance with claim 1, wherein the ring-shaped magnetic field source and/or the magnetic field enhancement ring and/or a magnetic correction ring are polarised in the same direction in relation to the surface normal.

17. The vacuum arc vaporization source in accordance with claim 1, wherein the ring-shaped magnetic field source and/or the magnetic field enhancement ring and/or a magnetic correction ring are polarised in opposition in relation to the surface normal.

18. The vacuum arc vaporization source in accordance with claim 1, wherein a cooling system is provided for the cooling of the arc vaporization source.

19. The vacuum arc vaporization source in accordance with claim 1, wherein the ring-shaped magnetic field source and/or the magnetic field enhancement ring and/or a magnetic correction ring includes a high temperature magnet.

20. The vacuum arc vaporization source in accordance with claim 1, wherein the ring-shaped magnetic field source is arranged on a mounting block, and a BN insulation is provided between the mounting bock and the cathode for the restriction of the arc discharge on the vaporization surface of the cathode.

21. The vacuum arc vaporization source in accordance with claim 20, wherein the mounting block includes a primary anode for the ignition and maintenance of the arc discharge.

22. The vacuum arc vaporization source in accordance with claim 21, wherein the primary anode is insulated electrically relative to the mounting block.

23. The vacuum arc vaporization source in accordance with claim 20 wherein the BN insulation is in touching contact with the cathode for the ignition and maintenance of the arc discharge.

24. The vacuum arc vaporization source in accordance with claim 1, wherein the arc vaporization source includes a pivotable trigger device for the ignition of the arc discharge which is either linearly movably or rotatably arranged.

25. An arc vaporization chamber including the vacuum arc source in accordance with claim 1.

26. The vacuum arc vaporization chamber in accordance with claim 25 wherein the cathode body of the vacuum arc vaporization source and the arc vaporization chamber are connected to an electrical energy supply unit and the arc vaporization chamber is connected electrically as an anode in relation to the cathode body.

27. The arc vaporization chamber in accordance with claim 25 wherein the arc vaporization chamber is electrically connected via an electrical resistance to a primary anode electrically insulated from the mounting block.

28. The arc vaporization chamber in accordance with claim 26, wherein the primary anode electrically insulated from the mounting block is connected to a positive pole of an auxiliary electrical supply unit and the arc vaporization chamber is connected to a negative pole of the auxiliary electrical supply unit.

29. The arc vaporization chamber in accordance with claim 28 wherein the electrical energy supply unit and/or the auxiliary electrical supply unit is a direct voltage electrical energy source.

30. The arc vaporization chamber in accordance with claim 28, wherein the electrical energy supply unit and/or the auxiliary electrical supply unit is a pulsed electrical energy source.

31. The vacuum arc vaporization source in accordance with claim 1, wherein the magnetic field enhancement ring comprises a plurality of permanent magnets.

32. The vacuum arc vaporization source in accordance with claim 19, wherein the high temperature magnet is made of SmCo.

33. The vacuum arc vaporization source in accordance with claim 20, wherein the mounting block is made of copper.

34. The vacuum arc vaporization source in accordance with claim 1, further comprising a magnetic correction ring arranged between the magnetic field enhancing ring and the cathode base.

* * * * *